Aug. 25, 1964 F. A. SHIRLAND 3,146,138

VACUUM EVAPORATED BARRIER FOR A CDS CRYSTAL

Filed July 10, 1961

FRED A. SHIRLAND *INVENTOR.*

*BY* Robert J. Blanke Atty.

United States Patent Office 3,146,138
Patented Aug. 25, 1964

3,146,138
VACUUM EVAPORATED BARRIER FOR A CdS CRYSTAL

Fred A. Shirland, Lakewood, Ohio, assignor, by mesne assignments, to the United States of America as represented by the Secretary of the Air Force
Filed July 10, 1961, Ser. No. 122,751
1 Claim. (Cl. 148—187)

This invention relates to cadmium sulfide barrier layer cells, and more specifically to a method of forming a barrier layer on a cadmium sulfide single crystal or cadmium sulfide polycrystalline layer.

The cadmium sulfide barrier layer cell with which the present invention is concerned is of the type of cells which are set forth in U.S. Patent No. 2,844,640. The patented cells are solid state devices wherein a barrier layer is formed in or on a semiconducting cadmium sulfide crystal by converting a layer of N- or P-type cadmium sulfide to P- or N-type cadmium sulfide respectively, or contacting an N-type cadmium sulfide crystal with a metal having a work function greater than cadmium sulfide (such as copper or silver), or contacting a P-type cadmium sulfide crystal with a metal having a work function less than cadmium sulfide (such as indium or gallium).

The efficiency of photovoltaic cells of all kinds, including those of the type described in the present invention, is generally characterized as the proportion (usually percentage) of the light energy incident on the cell which is converted to electrical energy and successfully transferred to a properly selected external circuit. It is readily apparent that the overall efficiency of any photovoltaic cell will depend on the efficiency of the contacting electrodes, of the electrical conduction process in the crystal and to the external circuit, as well as to the efficiency of conversion from light to electrical energy in the region of the barrier. However, this invention is primarily concerned with the efficiency of conversion in and near the barrier layer of photovoltaic cells of cadmium sulfide, rather than to the efficiency of the other components of the cell or circuit.

The photovoltaic effect in cadmium sulfide has been known since 1954. It is known that if a crystalline slab of cadmium sulfide, made N-type semiconducting by the incorporation of suitable impurities during formation of the crystal, is contacted by deposing an ohmic electrode around the edge of one major surface of the crystal slab, applying a counter electrode by electroplating copper to cover the other major surface of the crystal slab, and then heating the whole in air, a "barrier" will be formed between the counter electrode and the semiconductive cadmium sulfide.

Figure 1:
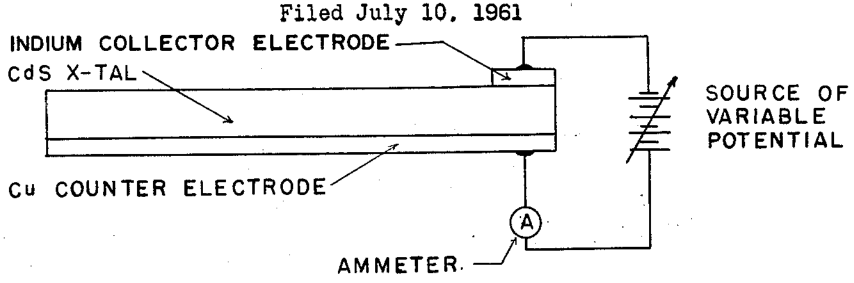
Figure 2:
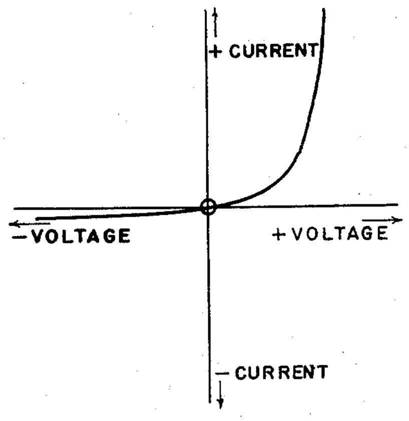

The above described process creates a "barrier layer" photovoltaic cell. The barrier is similar in effect to a junction between an N-type semiconductor and P-type semiconductor, except that a P–N junction is a point contact device and the P–N barrier is essentially an area device. Such barriers and junctions are characterized by rectifying properties; that is, when the device is placed in the dark, a variable source of electric potential is connected across the two electrodes of the cell, and a means of measuring the current flowing through the cell is inserted in the circuit, then relatively large amounts of current flow when the electric potential is connected with one polarity (known as the forward direction), and relatively small amounts of current flow through the cell when the electric potential is connected with the opposite polarity (known as the reverse direction). FIGURE 1 shows how the cell is connected for such rectifying measurements, and FIGURE 2 shows how much current flows through the cell when the electric potential is varied with both positive and negative connection. A curve, such as is shown in FIGURE 2, is obtained by changing the potential, measuring the current for each potential, and then plotting the curve through a number of such points. Such a curve can be obtained automatically by applying an A.-C. signal to the semiconductor barrier device and displaying the variation in voltage across the device and the current through the device in the X and Y directions respectively on the face of a suitably synchronized oscilloscope tube.

Figure 3:
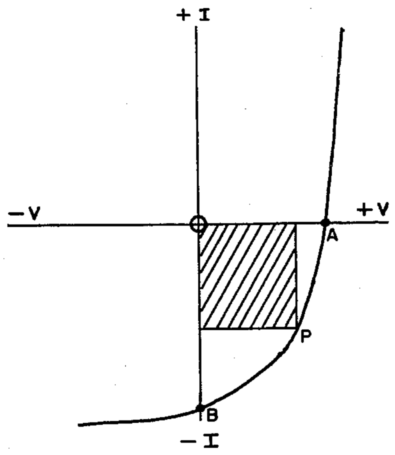

If now the photovoltaic cell, having in the dark a rectifying curve like that shown in FIGURE 2, is illuminated with light of suitable wavelengths and intensity then there will be generated within the cell an electric current that will be dependent upon the type and intensity of the illumination, the characteristics of the photovoltaic cell, and the external circuit connected to the cell. If the cell is connected to a source of alternating current and the current and voltage displayed on an oscilloscope tube, then the internally generated current will either add to or subtract from the externally impressed current. This will cause the curve traced on the face of the oscillograph tube to be displaced to the right and downwards, as is illustrated in FIGURE 3. This curve is known as the I–V characteristic curve of the cell.

Referring now to FIGURE 3, the value of the voltage at the point labelled "A" on the curve, where the current is zero, is known as the open circuit voltage of the cell. At the point labelled "B" on the curve, where the voltage is zero, there is a large amount of current flowing out of the cell, and this current is known as the shortcircuit current of the cell. This is the maximum amount of current that can be obtained from the cell at the given level of illumination.

The curve of FIGURE 3 can also give a measure of the power that can be drawn from the photovoltaic cell. It can be shown that the maximum power that can be drawn from such a cell is represented by the maximum area rectangle that can be drawn between the current and voltage axes and any point on the I–V characteristic curve. Hence, it is apparent that the I–V characteristic curve should be as rectangular as possible in order to secure maximum power from a photovoltaic cell. This "rectangularity" of the I–V characteristic curve is favored when the slope of the curve at the open circuit voltage point is a minimum and when the slope of the curve at the short circuit current point is a maximum. It has been shown that the slope of the curve at the open circuit voltage point is effectively the value of the internal series resistance of the equivalent circuit of the photovoltaic cell, while the slope of the curve at the short circuit current point is effectively the value of the internal shunt resistance of the equivalent circuit of the photovoltaic cell. Thus it is seen that the I–V characteristic curve of a photovoltaic cell is very useful in interpreting the performance and properties of the cell.

The principles and operation of a P–N junction or P–N barrier in silicon, gallium arsenide and certain other types of semiconductor photovoltaic cells are fairly well understood and are well known in the art. However, the detailed nature of the barrier in the cadmium sulfide barrier layer cell is still not well understood. Many workers have studied the cadmium sulfide barrier layer cell. Empirical efforts have led to the adoption of many variations in the process for forming barrier layers on cadmium sulfide crystals which have led to more efficient photovoltaic conversion from such cells. However, any real understanding of the nature of the barrier layer has apparently eluded these workers. It is known that the major conversion of light to electrical energy occurs in or near the barrier layer of the cadmium sulfide cell, and that this barrier layer is at the very surface of the crystal rather than projecting inward to any measurable depths into the bulk of the crystal. Careful detailed analyses have been made of the material at the barrier surface of the cadmium sulfide photovoltaic cells. It has been reasonably well established that the best barriers on cadmium sulfide are formed from the application of copper. However, the deposition of copper by itself does not usually form a barrier at the surface of cadmium sulfide yielding photovoltaic output in the range of those obtained by the method of the present invention. In those cases studied, it appeared that the copper must first be converted to a cuprous salt of the copper before a superior barrier layer can be formed. However, it has also appeared that once the barrier layer is formed from the conversion of the copper to cuprous oxide or cuprous sulfide and heat has subsequently been applied, then the presence of the cuprous oxide or cuprous sulfide is no longer required for photovoltaic action at the surface of the cell. That is, the cuprous oxide or cuprous sulfide can be removed, either by careful mechanical abrasion or by suitable chemical leaching, and the barrier remains intact at the surface of the crystal. Additional careful measurements have established that the barrier has not penetrated any appreciable distance into the crystal; that is, the barrier can be removed from the crystal by the removal of less than one ten-thousandth of an inch of material from the surface of the crystal.

The barrier is certainly formed by some action at the very surface of the cadmium sulfide crystal. This action could be a chemisorption process, it could be due to the action of surface states, or it could be the result of diffusion of cuprous ions a very short distance into the host lattice (on the order of 1 micron or less penetration) forming a shallow P-type conductivity cadmium sulfide layer on the surface of the crystal. While a variety of observations on the performance and methods of fabricating such cells have been made over a period of years, which at times have appeared to favor one or the other of the above listed possible mechanisms, there has been no preponderance of evidence to make possible general clear-cut agreement on one of the above listed three possible mechanisms.

The formation of a compound such as cuprous sulfide or cuprous oxide or some copper-cadmium-sulfur-oxygen complex at the surface of the cadmium sulfide crystal is conceivable, and might result in a very thin layer of some P-type material other than cadmium sulfide in intimate contact with the N-type cadmium sulfide host lattice thus forming a conventional P–N junction. However, repeated attempts to identify such a P-type compound or complex by X-ray and electron diffraction techniques have disclosed nothing at the surface of these barrier layer cells except cadmium sulfide and cuprous oxide. However, we have found that cuprous oxide can be removed from the surface of the cadmium sulfide barrier layer cell by leaching the surface with an ammonium chloride solution and subsequently rinsing and have an efficient barrier layer still existing at the surface of the crystal. Hence, there has been no substantial data supporting the contention of such a mechanism for the cadmium sulfide barrier cell.

The possibility that the barrier layer cell could be formed by the action of surface states at the surface of the cadmium sulfide crystal has recently received extended study, and it has been determined that surface states, that is, unsatisfied cadmium and sulfur "dangling bonds," could theoretically yield voltages equivalent to those actually observed in the cadmium sulfide barrier layer cell. However, these studies, as yet, have not been able to prove the existence of surface states capable of producing the observed photovoltaic power outputs actually obtained in cadmium sulfide surface barrier photovoltaic cells.

Theoretically, the solid state diffusion of cuprous ions a short distance into the cadmium sulfide crystal could convert a thin layer of this crystal to P-type cadmium sulfide and could create a P–N junction at that point in the crystal where the cuprous ions, acting as acceptor impurities, exactly counterbalance the indium or other donor impurities in the crystal lattice. The mechanism and functioning of such a P–N junction cell in certain other materials is well understood in the art and could conceivably be obtained in cadmium sulfide from an action which is commonly employed to form barrier layer cadmium sulfide photovoltaic cells. Recent evidence has suggested that it is unlikely that a finite diffusion of cuprous ions into the cadmium sulfide lattice can occur at the times and temperatures usually employed in heat treating these cells. The heat treatment normally given cadmium sulfide cells to form the barrier layer is done at a temperature of about 300° C. for times on the order of 10 to 30 seconds. While this could affect a shallow diffusion of cuprous ions into lattice vacancy sites or along dislocation lines, reasonably good cells have been fabricated in some instances with very little application of heat above room temperature. Also repeated attempts to measure a finite depth of cuprous ion penetration into cadmium sulfide barrier layer cells have been unsuccessful.

There is another indication that the barrier of the cadmium sulfide surface barrier cell is essentially a surface barrier. It has been shown that the response of the cadmium sulfide barrier layer cell results from light which is absorbed in the barrier layer itself (that is, the response of the cell results from light which is not absorbed in cadmium sulfide crystals prior to the application of the barrier). When cadmium sulfide crystals with established barriers are illuminated obliquely there is no increase in the amount of light absorbed in the barrier region over that light which is absorbed when the barrier is illuminated with the same light flux normal to the surface. If the barrier region were more than a surface region, that is having finite thickness, it would be expected that its absorption of light would increase with an increase in the length of the path of the light beam passing through it. Very careful measurements have been made, but no such increase in the light absorption with the presumed longer path length has been observed.

It is possible that the barrier of the cadmium sulfide photovoltaic cell may consist of many point contact of some kind of P-type material, or of many contacts of P-type CdS material, or of surface states on the surface of the N-type cadmium sulfide. If the barrier were in fact a multi-point contact barrier rather than a continuous barrier layer, the texture of the cadmium sulfide crystal surface prior to barrier formation would be extremely important. It has indeed been found that this is the case. A smooth, polished crystal surface results in comparatively low efficiency photovoltaic cells being formed while a crystal having an abraded surface results in photovoltaic cells having higher efficiency.

If the barrier does consist of many contacts of some type of P-type material on N-type cadmium sulfide, then these regions should act selectively in an electroplating bath. To delineate the presumed P-type regions on the surface of an N-type cadmium sulfide crystal, an attempt was made to anodically plate selenium on to the barrier surface of several cadmium sulfide barrier layer cells. This was done by dissolving selenium metal in a hot concentrated solution of potassium hydroxide, and using this solution as an electroplating bath. A strip of platinum metal was used as an anode and a specially prepared cadmium sulfide barrier surface layer was made the cathode. The cadmium sulfide cells were strongly illuminated to increase the current flow (by reducing the electrical resistance of the barrier layer) and a current of about 10 milliamperes for an area of about 1 cm.$^2$ was maintained for a period of approximately 5 minutes. Selenium was plated out onto the entire surface of the cell, but under microscopic examination it was observed that selenium covered about half of the exposed surface and was in the form of small discrete islands of plated material, though these islands were joined to form a more or less continuous phase. The approximate range of diameters of these "islands" of plated selenium was about 1 to 5 microns. If this electroplated selenium layer were removed by gently rubbing with a soft tissue and the cells replated in the same solution, then it was observed that the same geometric configuration of these islands resulted. This indicated that the anodic plating of selenium resulted from some "P-type characteristic" of the cadmium sulfide crystal surface rather than to the random nucleation of electroplated ions from the electroplating solution.

However, the nature of these presumed P-type contact regions at the surface of the cadmium sulfide crystal has still not been resolved. Cells fabricated by the general techniques outlined in the present invention have yielded photovoltaic conversion efficiencies in the range of several percent and more of the incident solar radiation intensity. These conversion efficiencies have been obtained by means of extensive improvements in the techniques of forming the barrier layer on the surface of cadmium sulfide crystals, even though the exact operation of these improvements have not been fully understood.

Barrier layers formed on cadmium sulfide crystals by means of the prior art were formed by electroplating copper on cadmium sulfide crystals, heating the copper and then contacting the copper barrier layer with suitable external leads. Standard copper electroplating techques were employed in the manufacture of these cells, which generally resulted in the formation of a smooth copper coating. The cells produced by this method had relatively poor efficiency and were extremely variable in their performance from cell to cell. It is now believed that part of the reason for this poor performance was that the smooth copper plate did not lend itself readily to oxidation to the cuprous oxide form of copper, and thus resulted in only partially converted copper layers, or in over converted copper layers, that is, where the oxidation process proceeded beyond the cuprous oxide state to some degree of the cupric oxide state. The fact that very occasionally some very small area cadmium sulfide photovoltaic cells were obtained which were reasonably efficient now appears to have resulted from the extreme variability of the process.

It is, therefore, an object of this invention to prepare a high efficiency barrier layer cell.

It is a further object of this invention to prepare a high efficiency barrier layer cell by means of a vacuum evaporated barrier layer coating operation.

It is a still further object of this invention to prepare large area barrier layers on cadmium sulfide crystals by means of a vacuum evaporation operation.

I have now discovered a method for forming a barrier layer on a cadmium sulfide single crystal or polycrystalline layer comprising depositing a copper compound on the cadmium sulfide crystal or polycrystalline layer by means of vacuum evaporation. The copper compounds which are suitable for the vacuum evaporation process of this invention are cuprous sulfide, cuprous selenide, cuprous chloride, cuprous bromide, cuprous oxide, and elemental copper. Cuprous sulfide is the preferred compound since this material is most stable in the vacuum evaporation process and requires a minimum of subsequent processing to prepare barrier layers on cadmium sulfide.

In preparing the vacuum evaporated barrier layer cells on cadmium sulfide crystals of this invention, the selected copper compound is vacuum evaporated onto a clean (etched) cadmium sulfide crystal surface, to a thickness of approximately 100 angstroms. The coated crystal is then heated at about 300–350° C. for a period of 5 to 10 seconds to insure maximum output of the cell.

As a modification of this technique, the copper compounds may be vacuum evaporated onto a cadmium sulfide crystal which has been preheated.

Best results have been obtained with the method of this invention when the crystal surface is finely abraded prior to coating operations. The surface abrasion of the crystal may be carried out by methods such as, for instance, lapping with a fine abrasive grit or by sand blasting. Various methods of mechanically disturbing the surface of cadmium sulfide crystals have shown that lapping with approximately 100 grit $Al_2O_3$ abrasive has given optimum results.

It has been found that the success of the vacuum evaporated method of forming barriers on cadmium sulfide crystals depends upon the completeness and intimateness of coverage of the crystal surface with the vacuum evaporated material. In order to obtain this complete and intimate coverage it has been found necessary that the material evaporated not form large crystallites on the surface of the cadmium sulfide crystal. In order to obtain a complete intimate coverage of the evaporated barrier forming material without forming large agglomerates or single crystallites on the surface of the cadmium sulfide, materials which do not form such agglomerates have been chosen. The cuprous sulfide salts have been found to give most nearly optimum results in this respect. Copper metal gives relatively poor results in this respect and therefore is not preferred for this operation.

Another characteristic of the material to be evaporated on the cadmium sulfide crystals for optimum results is that the material be stable through this operation. That is, the application of the necessary heat in order to vacuum evaporate the material must not decompose the compound. For this reason cuprous oxide is not preferred for this operation, since cuprous oxide tends to reduce in the vacuum with heat and deposits primarily as elemental copper on the cadmium sulfide crystal.

It has been found in preparing barrier layers on cadmium sulfide crystals by the technique of the present invention that all impurities and contaminants that might act as donor impurities in cadmium sulfide must be excluded. Likewise, the crystallite surface used as a substrate for this operation must be clean and free of impurities and contaminants which might act as a donor impurity and thus cause local shorting or tunneling through the barrier layer. Included in such donor type impurities are the metallic compounds comprising group III*b* of the periodic table and the group VII*b* anions such as the halides, as well as elements with multiple valance states which can act as donors in cadmium sulfide crystals under certain circumstances.

The efficiencies of cells prepared according to the vacuum evaporated coating method of this invention were determined by subjecting the cells to light from a standard light source, the intensity of which was accurately measured, and comparing the energy of this light source with the amount of energy delivered to a resistive load connected across the leads of the barrier layer cadmium sulfide cell. Also, the cells were measured by displaying their I-V characteristic curve on the face of an oscilloscope tube. It was found that high efficiency cadmium sulfide photovoltaic cells were obtained by the method of this invention and that these high efficiency cadmium sulfide cells had rectangularly-shaped I-V characteristic curves exhibiting a high shunt resistance and low series resistance. Also it was found that large areas of barrier layers could be applied by this method economically compared with the method of electroplating. The higher efficiencies of the cells resultant on the vacuum evaporated coating process are believed due to the formation of a barrier layer from very clean and very finely divided particles of cuprous sulfide on the surface of the cadmium sulfide crystal.

Having thus disclosed my invention, what I claim is:

A method for forming a barrier layer on a previously finely abraded surface of a cadmium sulfide single crystal comprising depositing a cuprous sulfide coating approximately 100 angstroms thick on said single crystal by vacuum evaporation, then subjecting the coated crystal to a heat treatment under continued vacuum evaporation at about 300–350° C. for about 5 to 10 seconds, said heat treatment being followed by leaching said barrier so formed with a solution of ammonium chloride and rinsing said barrier.

References Cited in the file of this patent

UNITED STATES PATENTS

| | | |
|---|---|---|
| 2,736,848 | Rose | Feb. 28, 1956 |
| 2,742,376 | Thomsen | Apr. 17, 1956 |
| 2,743,430 | Schultz et al. | Apr. 24, 1956 |

| | | |
|---|---|---|
| 2,810,052 | Bube et al. | Oct. 15, 1957 |
| 2,820,841 | Carlson et al. | Jan. 21, 1958 |
| 2,844,640 | Reynolds | July 22, 1958 |
| 2,916,678 | Bube et al. | Dec. 8, 1959 |
| 3,009,841 | Faust | Nov. 21, 1961 |
| 3,062,750 | Umberger | Nov. 6, 1962 |

OTHER REFERENCES

Pauling: General Chemistry, W. H. Freeman Co., 2nd Ed., 1954, pp. 471–489.